(12) United States Patent
Houle et al.

(10) Patent No.: US 8,637,602 B2
(45) Date of Patent: Jan. 28, 2014

(54) STABILIZATION OF VINYL ETHER MATERIALS

(75) Inventors: Frances Anne Houle, Fremont, CA (US); Hiroshi Ito, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 709 days.

(21) Appl. No.: 12/335,575

(22) Filed: Dec. 16, 2008

(65) Prior Publication Data
US 2009/0092767 A1  Apr. 9, 2009

Related U.S. Application Data

(62) Division of application No. 11/219,218, filed on Sep. 2, 2005, now Pat. No. 7,488,771.

(51) Int. Cl.
C08L 83/00 (2006.01)
C07D 279/18 (2006.01)

(52) U.S. Cl.
USPC ............... 524/588; 528/12; 544/35

(58) Field of Classification Search
USPC ............... 524/588; 528/12; 544/35
See application file for complete search history.

(56) References Cited

U.S. PATENT DOCUMENTS

| | | | |
|---|---|---|---|
| 4,757,098 A | 7/1988 | Merrem et al. |
| 5,260,172 A | 11/1993 | Ito |
| 5,514,727 A | 5/1996 | Green et al. |
| 5,695,910 A | 12/1997 | Urano et al. |
| 5,712,078 A | 1/1998 | Huang et al. |
| 5,780,206 A | 7/1998 | Urano et al. |
| 6,334,960 B1 | 1/2002 | Willson et al. |
| 6,686,124 B1 | 2/2004 | Angelopoulos et al. |
| 6,703,190 B2 | 3/2004 | Elian et al. |
| 6,719,915 B2 | 4/2004 | Willson et al. |
| 6,723,488 B2 | 4/2004 | Kudo et al. |
| 6,747,071 B1 | 6/2004 | Frances |
| 2002/0120070 A1 | 8/2002 | Hong et al. |
| 2002/0127789 A1 | 9/2002 | Hong et al. |
| 2003/0003397 A1 | 1/2003 | Hong et al. |
| 2003/0008240 A1 | 1/2003 | Elian et al. |
| 2003/0219992 A1 | 11/2003 | Schaper |
| 2004/0197706 A1 | 10/2004 | Wada et al. |
| 2004/0253537 A1 | 12/2004 | Rushkin et al. |
| 2004/0253542 A1 | 12/2004 | Rushkin et al. |
| 2007/0051697 A1 | 3/2007 | DiPietro et al. |

OTHER PUBLICATIONS

Notice of Allowance (mail Date Oct. 1, 2008) for U.S. Appl. No. 11/219,218, filed Sep. 2, 2005; Confirmation No. 2440.
E. K. Kim et al.; Vinyl Ethers in Ultraviolet Curable Formulations for Step and Flash Imprint Lithography; 2004 American Vacuum Society; J. Vac. Sci. Technol., B 22(1); Jan./Feb. 2004; pp. 131-135.
Ito, Hiroshi; Top Surface Imaging Systems Utilizing Poly(Vinylbenzoic Acid)and Its Ester; Journal of Photopolymer Science and Technology; vol. 5; No. 1 (1992); pp. 123-140.
S. C. Johnson et al.; Advances in Step and Flash Imprint Lighography; Retrieved from the internet http://www.molecularimprints.com/NewsEvents/tech_articles/new_articles/UT_SFIL_SPIE_2003.pdf; Retrieved Oct. 15, 2008; 6 pages.
Ito, Hiroshi; Top Surface Imaging Systems Utilizing Poly(Vinylbenzoic Acid)and Its Ester; Journal of Photopolymer Science and Technology; vol. 5; No. 1 (1992); Jun. 11, 1992; pp. 123-140.

*Primary Examiner* — Joseph Kosack
(74) *Attorney, Agent, or Firm* — Schmeiser, Olsen & Watts

(57) ABSTRACT

A stable viscosity coating composition, a method of forming the stable viscosity coating composition and a method for using the stable viscosity coating composition in a micromolding imprint lithographic process, such as Step and Flash Imprint Lithography is disclosed. The stable viscosity coating composition may include at least one vinyl ether having at least one vinyl ether group ($-OCR=CR_2$), and a stabilizer, wherein the stabilizer may be 9-anthracenemethanol, a substituted 9-anthracenemethanol, phenothiazine, or a substituted phenothiazine. The coating composition may include a radiation sensitive photoacid generator (PAG). The method of forming the coating composition comprises combining at least one vinyl ether having at least one vinyl ether group ($-OCR=CR_2$), and at least one stabilizer.

12 Claims, 4 Drawing Sheets

STABILIZATION OF VINYL ETHER MATERIALS

This application is a division of U.S. patent application Ser. No. 11/219,218 filed on Sep. 2, 2005.

TECHNICAL FIELD

This invention relates generally to stabilizing coating compositions that include vinyl ethers, and more specifically, to stabilizing coating compositions having vinyl ethers and radiation sensitive photoacid generators (PAGs), while preserving their ability to polymerize in the presence of a PAG and radiation.

BACKGROUND

Coating compositions have a wide range of applications such as molding to create relief images from relief patterns on a mold. Step and Flash Imprint Lithography is one such molding process that uses coating compositions for forming relief images. In micro-molding or imprint processes, a UV transparent template having a relief pattern therein is used as a mold to form a relief image on a coating of a substrate, according to the topography of the relief pattern. The relief pattern of the template contacts the coating. Exposing the coating to radiation through the UV transparent template causes curing of the coating so that the coating becomes a solid. Subsequent release of the UV transparent template from the cured or polymerized solidified coating produces a relief image that is used as a protective stencil in subsequent additive or subtractive etch procedures.

As the need for higher and higher levels of integration has arisen in the industry, the need for higher resolution of the replication process, i.e., for forming a larger number of lines and spaces in a given area of the substrate has increased dramatically. Therefore, there is a need for improved coating compositions that cure when they are subjected to radiation, such as UV light.

SUMMARY OF THE INVENTION

Accordingly, the present invention provides a stable viscosity coating composition, comprising: at least one vinyl ether having at least one vinyl ether group (CR2=CRO—) and a stabilizer for stabilizing a viscosity of the stable viscosity coating composition. The at least one vinyl ether may be represented by one of the following structures (I-VI):

The stabilizer includes at least one of i) a substituted 9-anthracenemethanol (VII) having a structure as follows:

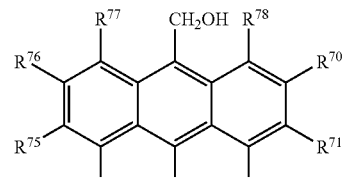

(VII)

wherein the substituted 9-anthracenemethanol is not 9-anthracenementhanol, and ii) a substituted phenothiazine having a structure as follows:

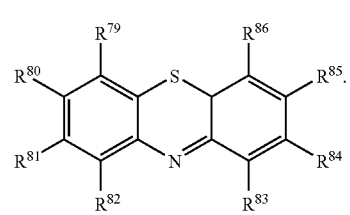

(VIII)

Each D, E, F, G, J, and K of the at least one vinyl ether independently at each occurrence represents either a carbon or a silicon atom.

Each n, o, p, q, r, s, t, U, v, w, x, y and z (n-z) independently at each occurrence may represent integers from 0 to 6, wherein a sum of the integers (n-z) in any one of the vinyl ethers is ≤6.

Each $R^1, R^2, R^3, R^4, R^5, R^6, R^7, R^8, R^9, R^{10}, R^{11}, R^{12}, R^{13}, R^{14}, R^{15}, R^{16}, R^{17}, R^{18}, R^{19}, R^{20}, R^{21}, R^{22}, R^{23}, R^{24}, R^{25}, R^{26}, R^{27}, R^{28}, R^{29}, R^{30}, R^{31}, R^{32}, R^{33}, R^{34}, R^{35}, R^{36}, R^{37}, R^{38}, R^{39}, R^{40}, R^{41}, R^{42}, R^{43}, R^{44}, R^{45}, R^{46}, R^{47}, R^{48}, R^{49}, R^{50}, R^{51}, R^{52}, R^{53}, R^{54}, R^{55}, R^{56}, R^{57}, R^{58}, R^{59}, R^{60}, R^{61}, R^{62}, R^{63}, R^{64}, R^{65}, R^{66}, R^{67}, R^{68}, R^{69}, R^{70}, R^{71}, R^{72}, R^{73}, R^{74}R^{75}, R^{76}, R^{77}, R^{78}, R^{79}, R^{80}, R^{81}, R^{82}, R^{83}, R^{84}, R^{85}, R^{86}$ and $R^{87}$ ($R^1$-$R^{87}$) may be independently at each occurrence a hydrogen atom, a fluorine atom or a hydrocarbyl substituent with a primary, a secondary or a tertiary carbon attachment point.

The hydrocarbyl substituent may be selected from the group consisting of a linear alkyl or a linear alkoxy group having 1-6 carbon atoms, a branched alkyl or branched

(I)

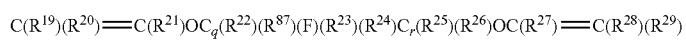

(II)

(III)

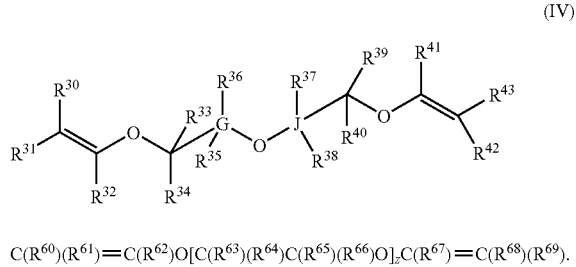

(IV)

(V)

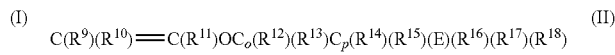

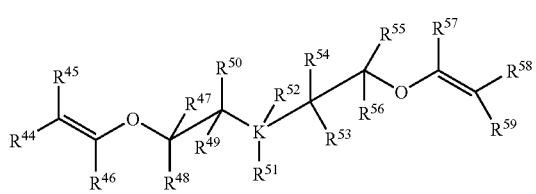

(VI)

alkoxy group having 2-12 carbon atoms, a cycloalkyl, a bicycloalkyl, a cycloalkoxy or a bicycloalkoxy group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, an aryl group, an aralkyl group, an alkaryl group, an alkenyl group, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tris-trialkysily group, a tris-triarylsilyl group, a tris-trialkarylsilyl group, a tris-triaralkylsilyl group, a tris-trialkenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group.

The alkyl substituents in the tris-trialkylsilyl group may include linear, branched, cyclic or bicyclic alkyl substituents having 1 to 21 carbon atoms. The aryl substituents in the tris-triarylsilyl group may include phenyl, naphthyl or phenanthryl.

The alkaryl substituents in the tris-trialkarylsilyl group may include tolyl.

The aralkyl substituents in the tris-triaralkylsilyl group may include benzyl.

The alkenyl substituents in the tris-trialkenylsilyl group may include vinyl.

The fluoroalkyl substituents in the tris-trifluoroalkyl group may include linear or branched fluorinated alkyl groups having 2-12 carbon atoms, or fluorinated cycloalkyl groups having 3-17 carbon atoms.

The alkynl substituents in the tris-trialkynylsilyl group may include ethynyl groups.

Any two $R^1$-$R^{87}$ in the same molecule of the at least one vinyl ether (I-VI) and the stabilizers (VII-VIII) may be linked to form a three- to eight-membered cyclic group.

The stable viscosity coating composition may further comprise a radiation sensitive photoacid generator (PAG).

A second aspect of the present invention provides a method for forming a stable viscosity coating composition, comprising: combining a vinyl ether with a stabilizer to form the stable viscosity coating composition. The ether comprises from about 70 to about 98.8 parts by weight per 100 parts by weight of the coating composition. The vinyl ether comprises at least one vinyl ether having at least one vinyl ether group (CR2=CRO—). The at least one vinyl ether may be represented by the following structures (I-VI):

The stabilizer may include at least one of i) a substituted 9-anthracenemethanol (VII) having a structure as follows:

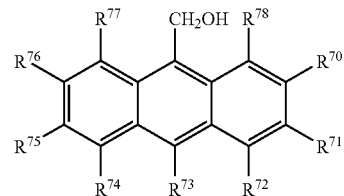

and ii) a substituted phenothiazine (VIII) having a structure as follows:

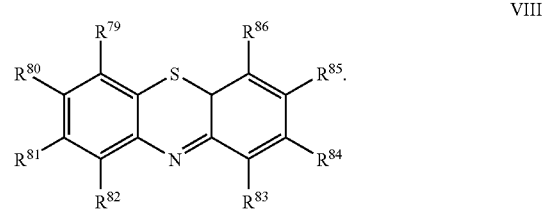

Each D, E, F, G, J, and K may be independently at each occurrence either a carbon or a silicon atom.

Each n, o, p, q, r, s, t, u, v, w, x, y and z (n-z) may be independently at each occurrence integers from 0 to 6, wherein a sum of the integers (n-z) in any of the vinyl ethers is ≤6.

Each $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{30}$, $R^{31}$, $R^{32}$, $R^{33}$, $R^{34}$, $R^{35}$, $R^{36}$, $R^{37}$, $R^{38}$, $R^{39}$, $R^{40}$, $R^{41}$, $R^{42}$, $R^{43}$, $R^{44}$, $R^{45}$, $R^{46}$, $R^{47}$, $R^{48}$, $R^{49}$, $R^{50}$, $R^{51}$, $R^{52}$, $R^{53}$, $R^{54}$, $R^{55}$, $R^{56}$, $R^{57}$, $R^{58}$, $R^{59}$, $R^{60}$, $R^{61}$, $R^{62}$, $R^{63}$, $R^{64}$, $R^{65}$, $R^{66}$, $R^{67}$, $R^{68}$, $R^{69}$, $R^{70}$, $R^{71}$, $R^{72}$, $R^{73}$, $R^{74}$, $R^{75}$, $R^{76}$, $R^{77}$, $R^{78}$, $R^{79}$, $R^{80}$, $R^{81}$, $R^{82}$, $R^{83}$, $R^{84}$, $R^{85}$, $R^{86}$ and $R^{87}$ ($R^1$-$R^{87}$) may be independently at each occurrence a hydrogen atom, a fluorine atom or a hydrocarbyl substituent with a primary, a secondary or a tertiary carbon attachment point.

The hydrocarbyl substituent may be selected from the group consisting of a linear alkyl or a linear alkoxy group having 1-6 carbon atoms, a branched alkyl or branched alkoxy group having 2-12 carbon atoms, a cycloalkyl, a bicycloalkyl, a cycloalkoxy or a bicycloalkoxy group having 3-17 carbon atoms, a fluorinated linear alkyl group having 2-12 carbon atoms, a fluorinated branched alkyl group having 2-12

$$C(R^1)(R^2)=C(R^3)OC_n(R^4)(R^5)(D)(R^6)(R^7)(R^8) \quad (I)$$

$$C(R^9)(R^{10})=C(R^{11})OC_o(R^{12})(R^{13})C_p(R^{14})(R^{15})(E)(R^{16})(R^{17})(R^{18}) \quad (II)$$

$$C(R^{19})(R^{20})=C(R^{21})OC_q(R^{22})(R^{87})(F)(R^{23})(R^{24})C_r(R^{25})(R^{26})OC(R^{27})=C(R^{28})(R^{29}) \quad (III)$$

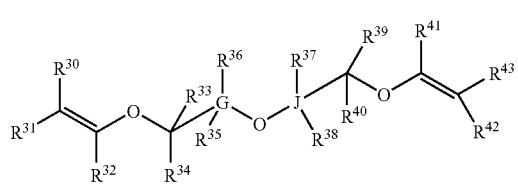

(IV)

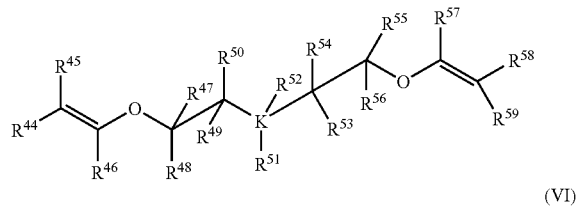

(V)

$$C(R^{60})(R^{61})=C(R^{62})O[C(R^{63})(R^{64})C(R^{65})(R^{66})O]_zC(R^{67})=C(R^{68})(R^{69}). \quad (VI)$$

carbon atoms, a fluorinated cycloalkyl group having 3-17 carbon atoms, an aryl group, an aralkyl group, an alkaryl group, an alkenyl group, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tris-trialkysily group, a tris-triarylsilyl group, a tris-trialkarylsilyl group, a tris-triaralkylsilyl group, a tris-trialkenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group.

The alkyl substituents in the tris-trialkylsilyl group include linear, branched, cyclic or bicyclic alkyl substituents having 1 to 21 carbon atoms.

The aryl substituents in the tris-triarylsilyl group include phenyl, benzyl, naphthyl or phenanthryl.

The alkaryl substituents in the tris-trialkarylsilyl group include tolyl.

The aralkyl substituents in the tris-triaralkylsilyl group include benzyl.

The alkenyl substituents in the tris-trialkenylsilyl group include vinyl.

The fluoroalkyl substituents in the tris-trifluoroalkyl group include linear or branched fluorinated alkyl groups having 2-12 carbon atoms, or fluorinated cycloalkyl groups having 3-17 carbon atoms.

The alkynl substituents in the tris-trialkynylsilyl group include ethynyl groups.

Any two $R^1$-$R^{87}$ in the same molecule of the at least one vinyl ethers (I-VI) and the stabilizers (VII-VIII) may be linked to form a three- to eight-membered cyclic group.

A third aspect of the present invention provides a method of using the coating composition, comprising: forming a transfer layer on a substrate from transfer layer material; coating the transfer layer with the coating of the second aspect of the present invention to form a coating; contacting the coating with a template having a relief pattern that includes recesses therein so that the coating essentially completely fills the recesses in the relief pattern in the template; forming a relief image in the coating by releasing the coating from the template, said releasing resulting in voids in the coating, wherein the relief image is a solidified reverse image replica of the relief pattern in the template.

The foregoing and other features and advantages of the invention will be apparent from the following more particular description of embodiments of the invention.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
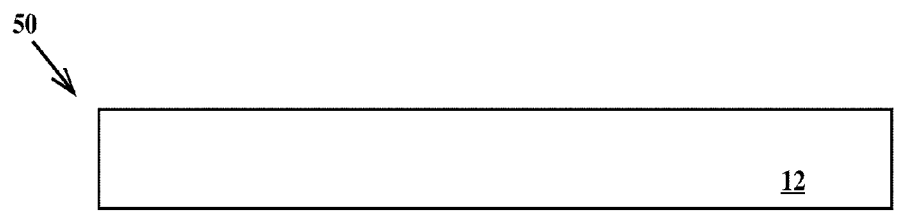
FIGS. 1 through 7 are partial cross-sectional views illustrating a semiconductor manufacturing process, according to the present invention.

A stable viscosity coating composition having a low viscosity may be beneficial in micro-molding imprint processes that use a rigid or flexible imprint template having a recessed pattern therein for patterning a substrate. The low viscosity may enable the stable viscosity coating composition to essentially completely fill recesses of the template without the need for high temperatures and pressures. If the micro-molding imprint process is a Step and Flash Imprint Lithography process, the rigid or flexible imprint template may be UV transparent, allowing exposure through the template to polymerize or cure the stable viscosity coating composition.

The stable viscosity coating composition of the present invention has a stable viscosity and is therefore an improvement over other coatings used in micro-molding imprinting processes because a viscosity stabilizer such as, for example, 9-anthracenemethanol, substituted 9-anthracenemethanol (VII), phenothiazine, or substituted phenothiazine (VIII) has been included that stabilizes the low viscosity, without impairing its ability to polymerize or cure in the presence of a radiation sensitive photoacid generator (PAG) and radiation. This permits such a coating composition to fill the recesses of a relief pattern better than coatings of the prior art.

In certain embodiments of the present invention, the stable viscosity coating composition may form a coating on a transfer layer on a substrate. Contacting the coating with the template having the recessed pattern therein results in essentially completely filling the recesses of the template, to transfer the pattern to the coating. Exposing the coating to radiation such as UV having a wavelength less than or equal to 365 nm cures the coating. A relief image is formed when the coating is released from the template, wherein the relief image may be an exact solid reverse image replica of the recessed pattern in the template.

In certain embodiments of the present invention, the relief image may either act as a protective stencil during subsequent etching procedures or the relief image may be used to create a reverse imprint of the relief image. The relief image or the reverse imprint may act as a protective stencil during subsequent etching procedures such as, for example, oxygen reactive ion etching (RIE), to transfer a patterned image based on the relief image or the reverse imprint to, for example, a device substrate to be patterned. It has been the experience of the inventors that achieving an essentially exact replica of the recessed pattern from the template in either the relief image or the reverse imprint may depend on a coating being able to essentially completely fill the recesses of the relief pattern of the UV transparent template. Therefore polymerization that might increase the viscosity of the coating prior to the aforementioned exposure step in the micro-molding process may be undesirable because the partially or completely polymerized coating may not essentially completely fill the recesses in the relief pattern as completely as may the stable viscosity coating compositions of the present invention.

A drawback of using an unstabilized coating composition that includes at least one vinyl ether is that the at least one vinyl ether may be easily polymerized by traces of acid. The acid may be introduced into the coating composition either by the PAG or from trace acid contamination of the vinyl ether itself, which may result in rapid polymerization of the coating composition even in the absence of light. It has been the inventor's experience that the unstabilized coating composition having at least one vinyl ether and PAG therefore may have a shortened shelf life during storage, even when exposure to radiation such as to light, particularly to UV, is rigorously prevented, such as by storing the stable viscosity coating composition in an opaque container. It has been the inventor's experience that some unstabilized coating compositions employing the at least one vinyl ether and PAG solidified within 20 days without UV exposure at ambient temperature even when the PAG may not be appreciably soluble in the stable viscosity coating composition, e.g., when the PAG is an aryl triflate or a sulfonate ester derived from a N-hydroxyamide, or a N-hydroxyimide. Thus, the storage stability of the coating composition having at least one vinyl ether may be a serious concern.

The inventors have found that addition of small amounts of 9-anthracenemethanol, substituted 9-anthracenemethanol (VII), phenothiazine, or substituted phenothiazine (VIII), e.g., less than or equal to 15 wt % based on the weight of the PAG in the stable viscosity coating composition, or less than or equal to 0.75 wt % based on the weight of the at least one vinyl ether in the stable viscosity coating composition may stabilize a viscosity of the stable viscosity coating compositions having at least one vinyl ether.

The stable viscosity coating composition may be characterized by a stable viscosity until it is be subjected to a curing environment. Hereinafter, "polymerizable," "polymerize", "polymerizing" or "to polymerize" relate to any chemical process that results in formation of a chain or polymer based on repeating monomers or oligomers, Hereinafter, "curable," "cure", "curing" or "to cure" relate to polymerization to high molecular weight with crosslinking. Since the stable viscosity coating compositions having the stable viscosities of the present invention may 1) consist essentially of at least one vinyl ether having one vinyl ether group ($R_2C$=CRO—), trace acid contamination and/or PAG, or 2) include at least one vinyl ether having at least two vinyl ether groups ($R_2C$=CRO—), trace acid contamination and/or PAG, exposing composition 1) to radiation may result in polymerization, or exposing composition 2) to radiation may result in curing, unless compositions 1) and 2) may be stabilized from undergoing polymerization or curing by addition of at least one stabilizer that includes 9-anthracenemethanol, substituted 9-anthracenemethanol (VII), phenothiazine or substituted phenothiazine (VIII). Hereinafter, "stabilized" refers to the period of time from when the stabilized coating composition is formulated until it is subjected to a polymerizing or curing environment. "Stabilized" may refer to a stable viscosity coating composition having a viscosity that does not drift from its initial viscosity to a higher viscosity for ≥10 months at ambient temperature unless it is subjected to, for example, radiation or heat in the presence of the PAG. The stable viscosity coating composition of the present invention may have a viscosity less than or equal to 10 cps at 20° C. and may be used as a stable viscosity coating composition at ambient temperature and pressure.

The stable viscosity coating composition prior to cure may include at least one vinyl ether having at least one vinyl ether group (CR2=CRO—), wherein the at least one vinyl ether may be represented by the following structures (I-VI):

and a stabilizer.

The stabilizer may include at least one of i) a substituted 9-anthracenemethanol (VII) having a structure as follows:

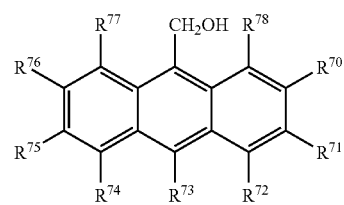

(VII)

and ii) a substituted phenothiazine (VIII) having a structure as follows:

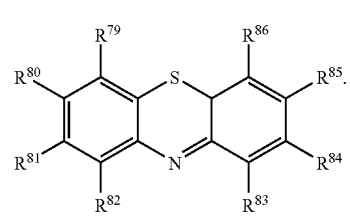

(VIII)

Each D, E, F, G, J, and K may be independently at each occurrence either a carbon or a silicon atom.

Each n, o, p, q, r, s, t, U, v, w, x, y and z (n-z) may be independently at each occurrence represented by integers from 0 to 6, wherein a sum of the integers (n-z) in any one of the vinyl ethers may be ≤6.

Each $R^1, R^2, R^3, R^4, R^5, R^6, R^7, R^8, R^9, R^{10}, R^{11}, R^{12}, R^{13}, R^{14}, R^{15}, R^{16}, R^{17}, R^{18}, R^{19}, R^{20}, R^{21}, R^{22}, R^{23}, R^{24}, R^{25}, R^{26}, R^{27}, R^{28}, R^{29}, R^{30}, R^{31}, R^{32}, R^{33}, R^{34}, R^{35}, R^{36}, R^{37}, R^{38}, R^{39}, R^{40}, R^{41}, R^{42}, R^{43}, R^{44}, R^{45}, R^{46}, R^{47}, R^{48}, R^{49}, R^{50}, R^{51}, R^{52}, R^{53}, R^{54}, R^{55}, R^{56}, R^{57}, R^{58}, R^{59}, R^{60}, R^{61}, R^{62}, R^{63}, R^{64}, R^{65}, R^{66}, R^{67}, R^{68}, R^{69}, R^{70}, R^{71}, R^{72}, R^{73}, R^{74}R^{75}, R^{76}, R^{77}, R^{78}, R^{79}, R^{80}, R^{81}, R^{82}, R^{83}, R^{84}, R^{85}, R^{86}$ and $R^{87}$ ($R^1$-$R^{87}$) may be independently at each occurrence a hydrogen atom or a hydrocarbyl substituent with a primary, a secondary or a tertiary carbon attachment point.

The hydrocarbyl substituent may be selected from the group consisting of a linear alkyl or a linear alkoxy group having 1-6 carbon atoms, a branched alkyl or branched alkoxy group having 2-12 carbon atoms, a cycloalkyl, a bicycloalkyl, a cycloalkoxy or a bicycloalkoxy group having 3-17

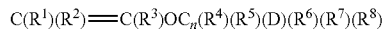

(I)

$C(R^1)(R^2)$=$C(R^3)OC_n(R^4)(R^5)(D)(R^6)(R^7)(R^8)$

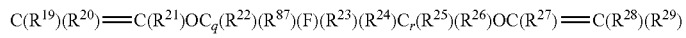

(II)

$C(R^9)(R^{10})$=$C(R^{11})OC_o(R^{12})(R^{13})C_p(R^{14})(R^{15})(E)(R^{16})(R^{17})(R^{18})$ (III)

$C(R^{19})(R^{20})$=$C(R^{21})OC_q(R^{22})(R^{87})(F)(R^{23})(R^{24})C_r(R^{25})(R^{26})OC(R^{27})$=$C(R^{28})(R^{29})$

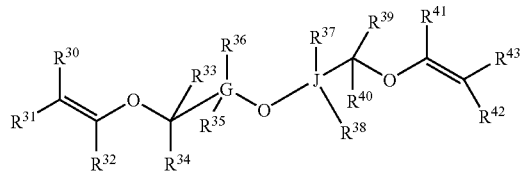

(IV)

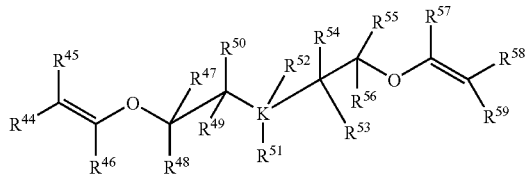

(V)

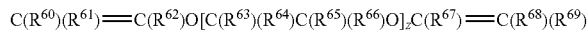

(VI)

$C(R^{60})(R^{61})$=$C(R^{62})O[C(R^{63})(R^{64})C(R^{65})(R^{66})O]_zC(R^{67})$=$C(R^{68})(R^{69})$ carbon atoms, a fluorinated linear alkyl group having 2-12 carbon atoms, a fluorinated branched alkyl group having 2-12 carbon atoms, a fluorinated cycloalkyl group having 3-17 carbon atoms, an aryl group, an aralkyl group, an alkaryl group, an alkenyl group, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tris-trialkysily group, a tris-triarylsilyl group, a tris-trialkarylsilyl group, a tris-triaralkylsilyl group, a tris-trialkenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group.

The alkyl substituents in the tris-trialkylsilyl group include linear, branched, cyclic or bicyclic alkyl substituents having 1 to 21 carbon atoms.

The aryl substituents in the tris-triarylsilyl group include phenyl, naphthyl or phenanthryl.

The alkaryl substituents in the tris-trialkarylsilyl group include tolyl

The aralkyl substituents in the tris-triaralkylsilyl group include benzyl.

The alkenyl substituents in the tris-trialkenylsilyl group include vinyl.

The fluoroalkyl substituents in the tris-trifluoroalkyl group include linear or branched fluorinated alkyl groups having 2-12 carbon atoms, or fluorinated cycloalkyl groups having 3-17 carbon atoms.

The alkynl substituents in the tris-trialkynylsilyl group include ethynyl groups.

Any two $R^1$-$R^{87}$ in the same molecule of the at least one vinyl ethers (1-VI) or the stabilizers (VII-VIII) may be linked to form a three- to eight-membered cyclic group.

The at least one vinyl ether (I) of the stable viscosity coating composition may be $CH_2$=$CHOCH_2Si(CH_3)_3$, wherein D is the silicon atom, wherein n is 1, wherein $R^1$, $R^2$, $R^3$, $R^4$ and $R^5$ are H, and wherein $R^6$, $R^7$ and $R^8$ are methyl groups.

Alternatively, the at least one vinyl ether (II) of the stable viscosity coating composition may be $CH_2$=$CHOCH_2CH_2Si(CH_3)_3$, wherein E is the silicon atom, wherein o and p are 1, wherein $R^9$, $R^{10}$, $R^{11}$, $R^{12}$, $R^{13}$, $R^{14}$ and $R^{15}$ are H, and wherein $R^{16}$, $R^{17}$ and $R^{18}$ are methyl groups.

Alternatively, the at least one vinyl ether (III) of the stable viscosity coating composition may be $CH_2$=$CHOCH_2Si(CH_3)_2CH_2OCH$=$CH_2$, wherein F is the silicon atom, wherein q and r are 1, wherein $R^{19}$, $R^{20}$, $R^{21}$, $R^{22}$, $R^{25}$, $R^{26}$, $R^{27}$, $R^{28}$ and $R^{29}$ are H, and wherein $R^{23}$ and $R^{24}$ are independently methyl groups or $CH_2$=$CHOCH_2C(CH_3)_2CH_2OCH$=$CH_2$, wherein F is the carbon atom, wherein q and r are 1, wherein $R^{19}$, $R^{20}$, $R^{21}$, $R^{22}$, $R^{25}$, $R^{26}$, $R^{27}$, $R^{28}$ and $R^{29}$ are H, and wherein $R^{23}$ and $R^{24}$ are methyl groups.

Alternatively, the at least one vinyl ether (IV) of the stable viscosity coating composition may be $CH_2$=$CHOCH_2Si(CH_3)_2OSi(CH_3)_2CH_2OCH$=$CH_2$, wherein G and J are the silicon atoms, wherein s and t are 1, wherein $R^{30}$, $R^{31}$, $R^{32}$, $R^{28}$, $R^{29}$, $R^{34}$, $R^{39}$, $R^{40}$, $R^{41}$, $R^{42}$ and $R^{43}$ are H and wherein $R^{35}$, $R^{36}$, $R^{37}$ and $R^{38}$ are methyl groups.

Alternatively, the at least one vinyl ether (V) of the stable viscosity coating composition may be $CH_2$=$CHOCH_2CH_2Si(CH_3)_2CH_2CH_2OCH$=$CH_2$, wherein K is the silicon atom, wherein q and r are 1, wherein $R^{44}$, $R^{45}$, $R^{46}$, $R^{47}$, $R^{48}$, $R^{49}$, $R^{50}$, $R^{53}$, $R^{54}$, $R^{55}$, $R^{56}$, $R^{57}$, $R^{58}$ and $R^{59}$ are H, wherein $R^{51}$ and $R^{52}$ are independently methyl groups or $CH_2$=$CHOCH_2CH_2C(CH_3)_2CH_2CH_2OCH$=$CH_2$, wherein K is the carbon atom, wherein q and r are 1, wherein $R^{44}$, $R^{45}$, $R^{46}$, $R^{47}$, $R^{48}$, $R^{49}$, $R^{50}$, $R^{53}$, $R^{54}$, $R^{55}$, $R^{56}$, $R^{57}$, $R^{58}$ and $R^{59}$ are H and wherein $R^{51}$ and $R^{52}$ are methyl groups.

Alternatively, the at least one vinyl ether (III) of the stable viscosity coating composition may be $CH(CH_3)$=$CHOCH_2Si(CH_3)(CH_2OCH$=$CH(CH_3))CH_2OCH$=$CH(CH_3)$, wherein F is the silicon atom, wherein q and r are 1, wherein $R^{19}$, $R^{21}$, $R^{22}$, $R^{25}$, $R^{26}$, $R^{27}$ and $R^{28}$ are H, wherein $R^{20}$, $R^{23}$ and $R^{29}$ are methyl, and wherein $R^{24}$ is —$CH_2OCH$=$CH(CH_3)$.

Alternatively, the at least one vinyl ether (II) of the stable viscosity coating composition may be $CH_2$=$CHOCH_2CH_2Si(Si(CH_3)_3)_3$, wherein E is the silicon atom, wherein o and p are 1, wherein $R^9$, $R^{10}$, $R^{11}$, $R^{12}$, $R^{13}$, $R^{14}$ and $R^{15}$ are H, and wherein $R^{16}$, $R^{17}$ and $R^{18}$ are trimethylsilyl groups.

Alternatively, the at least one vinyl ether (III) of the stable viscosity coating composition may be $CH(CH_3)$=$CHOCH_2C(CH_3)(CH_2OCH$=$CH(CH_3))CH_2OCH$=$CH(CH_3)$, wherein F is the carbon atom, wherein q and r are 1, wherein $R^{19}$, $R^{21}$, $R^{22}$, $R^{25}$, $R^{26}$, $R^{27}$ and $R^{28}$ are H, wherein $R^{20}$, $R^{23}$ and $R^{29}$ are methyl, and wherein $R^{24}$ is —$CH_2OCH$=$CH(CH_3)$.

Alternatively, the at least one vinyl ether (I) of the stable viscosity coating composition may be $CH_2$=$CHOCH_2CF_3$, wherein D is the carbon atom, wherein n is 1, wherein $R^1$, $R^2$, $R^3$, $R^4$ and $R^5$ are H, and wherein $R^6$, $R^7$ and $R^8$ are fluorine groups.

Alternatively, the at least one vinyl ether (I) of the stable viscosity coating composition may be dihydrofuran, wherein D is the carbon atom, wherein n is 0, wherein $R^1$ is methylene, wherein $R^2$, $R^3$, $R^4$ and $R^5$ are H, wherein $R^6$ is methylene, and wherein $R^7$ and $R^8$ are hydrogen atoms, or dihydropyran, wherein D is the carbon atom, wherein n is 1, wherein $R^1$ is methylene, wherein $R^2$, $R^3$, $R^4$ and $R^5$ are H, wherein $R^6$ is methylene, and wherein $R^7$ and $R^8$ are hydrogen atoms.

The stable viscosity coating composition may include a radiation sensitive photoacid generator (PAG). In certain embodiments of the present invention, PAGs may be used in the stable viscosity coating composition. These PAGs are compounds that generate an acid upon exposure to radiation. In various embodiments, any suitable photoacid generating agent may be used, so long as a mixture of the aforementioned stable viscosity coating composition and the selected photoacid generator dissolve sufficiently in the stable viscosity coating composition, or in the stable viscosity coating composition and an organic solvent, and the resulting solution thereof may form a coating on a substrate by a dispensing process, or spin coating, or the like. As is well known to those skilled in the art after reading the present application, the following illustrative classes of photoacid generators may be employed in various embodiments of the present invention.

Any suitable photoacid generator can be used in the present invention's stable viscosity coating composition. Typical photoacid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl) diazomethane, and bis(cyclohexylsulfonyl) diazomethane;

(4) trifluoromethanesulfonate esters of imides and hydroxyimides, e.g., α-(trifluoromethylsulfonyloxy)-bicyclo [2.2.1] hept-5-ene-2,3-dicarboximide (MDT);

(5) nitrobenzyl sulfonate esters such as 2-nitrobenzyl p-toluenesulfonate, 2,6dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones;

(10) s-triazine derivatives; and

(11) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

Additional suitable acid generators useful in conjunction with the stable viscosity coating compositions and methods provided herein will be known to those skilled in the art.

The PAG of the stable viscosity coating composition may include at least one of the following structures (X-XII):

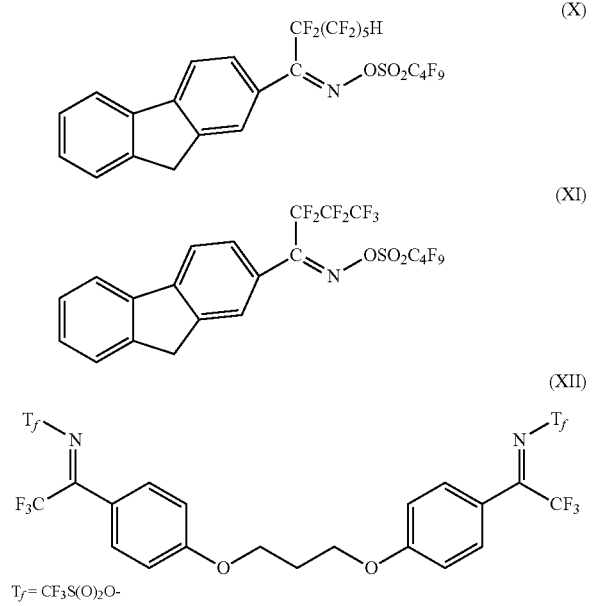

$T_f = CF_3S(O)_2O-$

Figure 2:
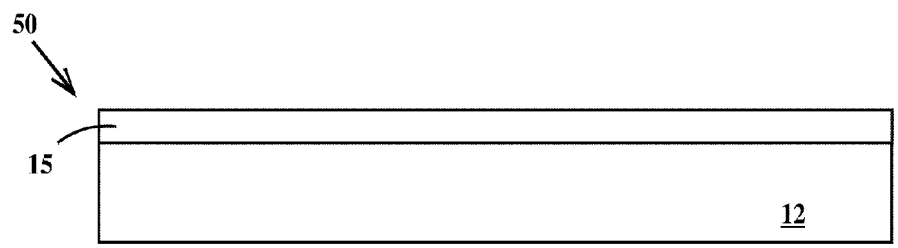
Figure 3:
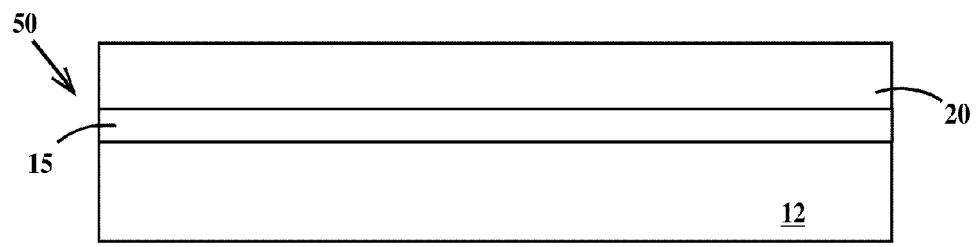
Figure 4:
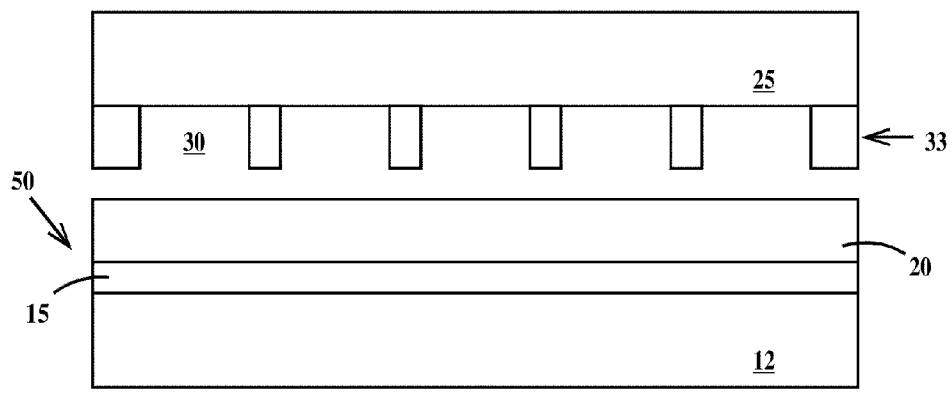
Figure 5:
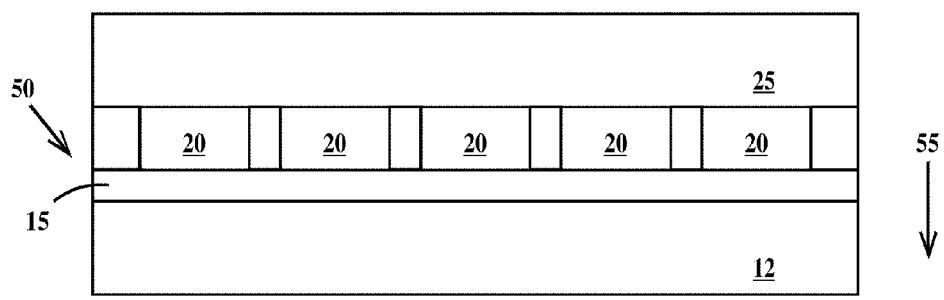
Figure 6:
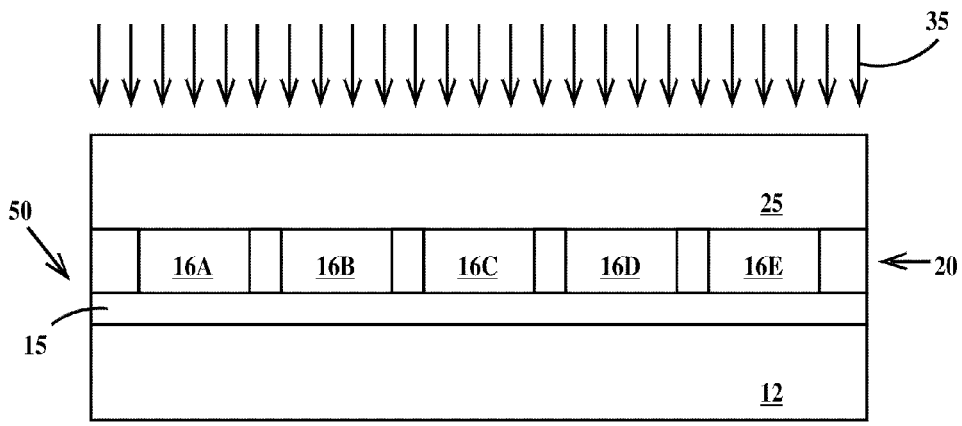
Figure 7:
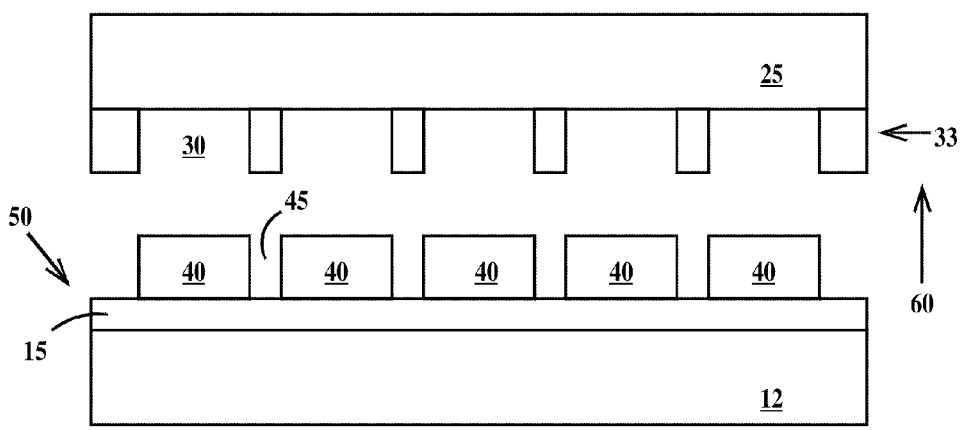
Figures 8, 9:
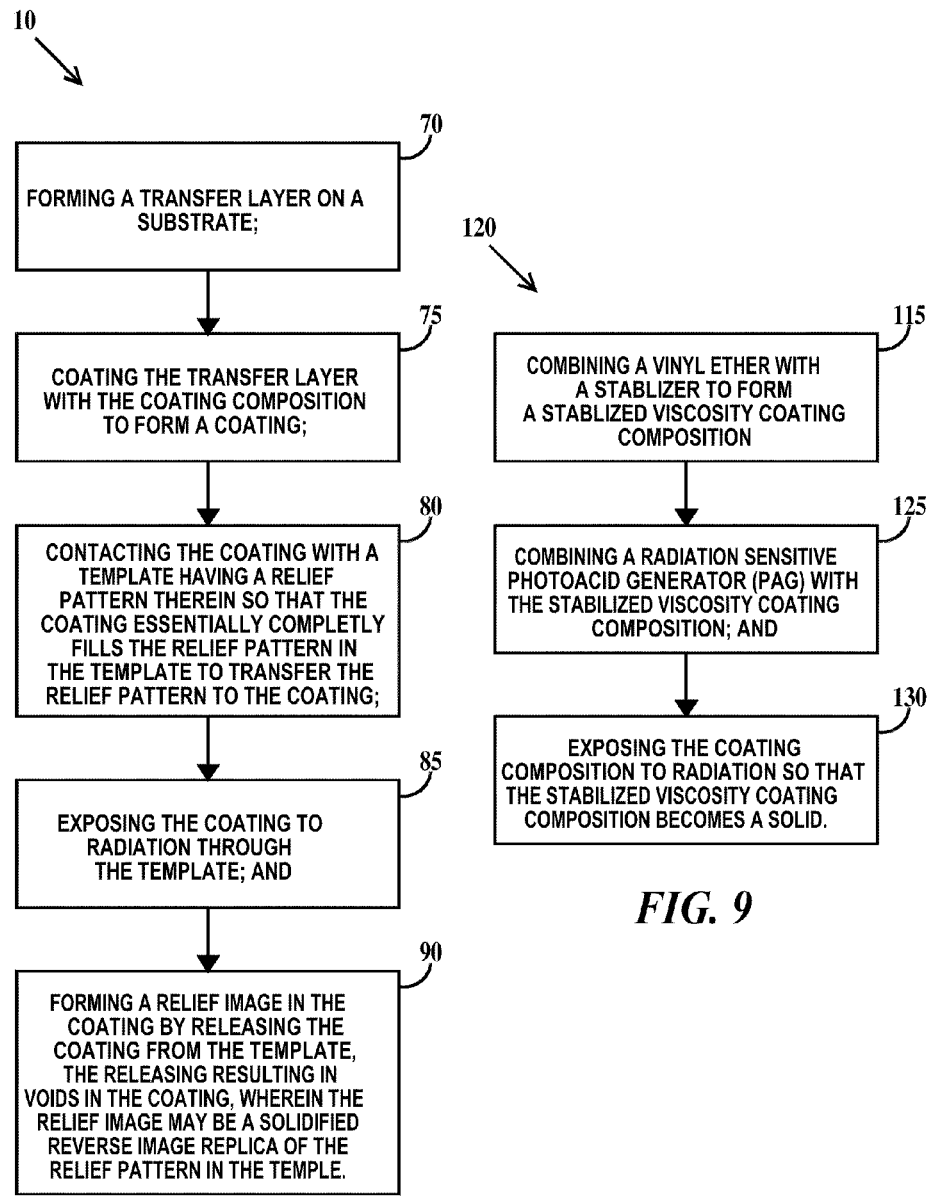
FIG. 8 is a flow sheet depicting a method of using a stable viscosity coating composition, according to the present invention.
FIG. 9 is a flow sheet depicting a method of forming a stable viscosity coating composition, according to the present invention.

FIGS. 1-7 depict a device 50 that may be formed using a method 10, as depicted in FIG. 8. The method 10 may be a micro-molding imprint lithographic method, such as a Step and Flash Imprint Lithographic (SFIL) method. In the method 10, a relief image 40, as depicted in FIG. 7, has been formed in a coating 20, as depicted in FIG. 6. The relief image 40 may be a solidified reverse image replica of the relief pattern 33 in the template 25, as depicted in FIGS. 4 and 6. FIG. 9 depicts process steps 115-130 of a method 120 for forming a stable viscosity coating composition.

FIG. 1 depicts a substrate 12 of the device 50.

FIG. 2 depicts the device 50 of FIG. 1 after a transfer layer 15 has been formed on the substrate 12. The transfer layer 15 may be formed from antireflective coatings or other appropriate materials known in the art such as, for example, thermoset polymers, thermoplastic polymers, polyepoxies, polyamides, polyurethanes, polycarbonates, polyesters, and combinations thereof.

FIG. 3 depicts the device 50 of FIG. 2, after a coating 20 has been formed on the transfer layer 15. The coating 20 includes a stable viscosity coating composition disclosed herein, comprising: at least one vinyl ether (I-VI); and the stabilizer that includes 9-anthracenemethanol, the substituted 9-anthracenemethanol (VII), phenothiazine or the substituted phenothiazine (VIII), or combinations thereof. The coating may advantageously further comprise a PAG. The stable viscosity coating composition is a low viscosity solution prior to being exposed to the imaging radiation discussed infra in conjunction with FIG. 6. In one embodiment, the stable viscosity coating composition of the present invention may have a viscosity less than or equal to 10 cps at 20° C. and may be used as a coating at ambient temperature and pressure.

FIG. 4 depicts the device 50 of FIG. 3 and a template 25, having a relief pattern 33 therein, prior to contacting the coating 20. The relief pattern 33 comprises recesses 30.

FIG. 5 depicts the device 50 of FIG. 4, when the template 25 having a relief pattern 33 has been brought into contact with the coating 20 by moving the template 25 in a direction of an arrow 55 and contacting the coating 20, so that the coating 20 may essentially completely fill the recesses 30 of the relief pattern 33 in the template 25.

FIG. 6 depicts the device 50 of FIG. 5, wherein the coating 20 is exposed through the template 25 to imaging radiation 35 because the template 25 is transparent, for example, to UV radiation. The radiation 35 is characterized by a wavelength such as, inter alia, 365 nm or less (e.g., 157 nm). The radiation 35 transmitted through the transparent template 25 strikes those portions 16A, 16B, 16C, 16D and 16E of the coating 20 that have essentially completely filled the recesses 30 of said transparent template 25. The radiation 35 causes the acid generator in portions 16A, 16B, 16C, 16D and 16E of the coating 20 to generate acid, which in turn causes the coating 20 to solidify.

FIG. 7 depicts the device 50 of FIG. 6 wherein a relief image 40 is formed in the coating 20 by releasing the coating 20 from the template 25, said releasing resulting in voids 45 in the coating 20, wherein the relief image 40 may be a solidified reverse image replica of the relief pattern 33 in the template 25. The coating 20 may be released from the template 25 by moving the template 25 in a direction of an arrow 60, said moving resulting in releasing the coating 20 from the template 25.

Micro-molding imprint lithography, such as Step and Flash Imprint Lithography, may utilize a low viscosity coating, such as the stable viscosity coating composition of the present invention. The low viscosity of the stable viscosity coating composition eliminates the need for high temperatures and pressures that may be needed to enable higher viscosity coatings to fill the recesses 30 of the template 40. (See FIG. 5.) The rigid or flexible imprint template 25 may be UV transparent, allowing exposure through the template 25 to cure the coating 20. The accompanying increase in viscosity of the coating 20 at this stage of the micro-molding lithographic process is needed to solidify the imprinted pattern, known as the relief image 40.

As the need for higher and higher levels of integration has arisen in the industry, the need for higher resolution of the replication process, i.e., for forming a larger number of lines and spaces in a given area of the substrate 12 has increased dramatically. Therefore, there is a need for the improved stable viscosity coating 20 until the coating 20 is subjected to a curable environment.

Referring to FIGS. 1-7, supra, FIG. 8 is a flowsheet of a method 10, such as the micro-molding or imprint process, comprising steps 70-90, for filling recesses 30 of a template 25 with the stable viscosity coating composition. Referring to FIG. 4, the recesses 30 may be a topography corresponding to the relief pattern 33 of the template 25, that defines the relief image 40 to be created in the coating 20, as depicted in FIG. 7 and described herein.

In the step 70 of the method 10, a transfer layer 15 may be formed on the substrate 12.

In the step 75 of the method 10, a coating 20 may be formed by coating the transfer layer 15 with a stable viscosity coating composition, comprising: combining a vinyl ether with a stabilizer to form said stable viscosity coating composition. The vinyl ether may comprise from about 70 to about 98.8 parts by weight per 100 parts by weight of the stable viscosity coating composition. The vinyl ether comprises:

at least one vinyl ether having at least one vinyl ether group (CR2=CRO—), wherein the at least one vinyl ether is represented by the following structures (I-VI):

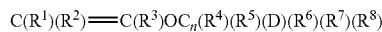

(I)

$C(R^1)(R^2)=C(R^3)OC_n(R^4)(R^5)(D)(R^6)(R^7)(R^8)$

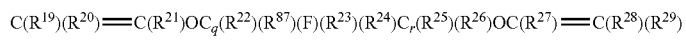

(II)

$C(R^9)(R^{10})=C(R^{11})OC_o(R^{12})(R^{13})C_p(R^{14})(R^{15})(E)(R^{16})(R^{17})(R^{18})$ (III)

$C(R^{19})(R^{20})=C(R^{21})OC_q(R^{22})(R^{87})(F)(R^{23})(R^{24})C_r(R^{25})(R^{26})OC(R^{27})=C(R^{28})(R^{29})$

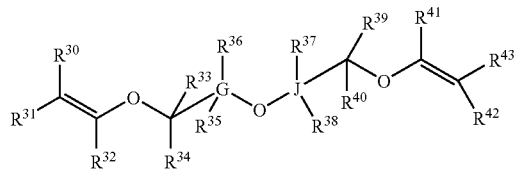

(IV) (V)

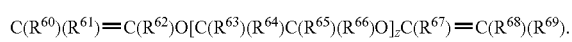

(VI)

$C(R^{60})(R^{61})=C(R^{62})O[C(R^{63})(R^{64})C(R^{65})(R^{66})O]_zC(R^{67})=C(R^{68})(R^{69})$.

The stable viscosity coating composition further comprises a stabilizer that includes at least one of i) a substituted 9-anthracenemethanol (VII), having a structure as follows:

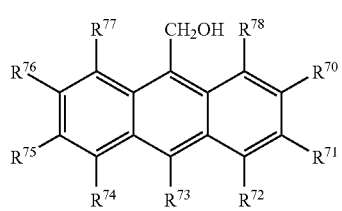

(VII)

and ii) a substituted phenothiazine (VIII), having a structure as follows:

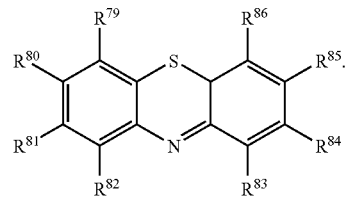

(VIII)

Each D, E, F, G, J, and K may comprises independently at each occurrence either a carbon or a silicon atom. Each n, o, p, q, r, s, t, u, v, w, x, y and z (n-z) may comprise independently at each occurrence integers from 0 to 6. A sum of the integers (n-z) in any of the vinyl ethers may be ≤6.

Each $R^1, R^2, R^3, R^4, R^5, R^6, R^7, R^8, R^9, R^{10}, R^{11}, R^{12}, R^{13}, R^{14}, R^{15}, R^{16}, R^{17}, R^{18}, R^{19}, R^{20}, R^{21}, R^{22}, R^{23}, R^{24}, R^{25}, R^{26}, R^{27}, R^{28}, R^{29}, R^{30}, R^{31}, R^{32}, R^{33}, R^{34}, R^{35}, R^{36}, R^{37}, R^{38}, R^{39}, R^{40}, R^{41}, R^{42}, R^{43}, R^{44}, R^{45}, R^{46}, R^{47}, R^{48}, R^{49}, R^{50}, R^{51}, R^{52}, R^{53}, R^{54}, R^{55}, R^{56}, R^{57}, R^{58}, R^{59}, R^{60}, R^{61}, R^{62}, R^{63}, R^{64}, R^{65}, R^{66}, R^{67}, R^{68}, R^{69}, R^{70}, R^{71}, R^{72}, R^{73}, R^{74}R^{75}, R^{76}, R^{77}, R^{78}, R^{79}, R^{80}, R^{81}, R^{82}, R^{83}, R^{84}, R^{85}, R^{86}$ and $R^{87}$ ($R^1$-$R^{87}$) may comprise independently at each occurrence a hydrogen atom, a fluorine atom or a hydrocarbyl substituent with a primary, a secondary or a tertiary carbon attachment point. The hydrocarbyl substituent may be selected from the group consisting of a linear alkyl or a linear alkoxy group having 1-6 carbon atoms, a branched alkyl or branched alkoxy group having 2-12 carbon atoms, a cycloalkyl, a bicycloalkyl, a cycloalkoxy or a bicycloalkoxy group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, an aryl group, an aralkyl group, an alkaryl group, an alkenyl group, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tris-trialkysily group, a tris-triarylsilyl group, a tris-trialkarylsilyl group, a tris-triaralkylsilyl group, a tris-trialkenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group.

The alkyl substituents in the tris-trialkylsilyl group may include linear, branched, cyclic or bicyclic alkyl substituents having 1 to 21 carbon atoms.

The aryl substituents in the tris-triarylsilyl group include phenyl, benzyl, naphthyl or phenanthryl.

The alkaryl substituents in the tris-trialkarylsilyl group may include tolyl.

The aralkyl substituents in the tris-triaralkylsilyl group may include benzyl.

The alkenyl substituents in the tris-trialkenylsilyl group may include vinyl.

The fluoroalkyl substituents in the tris-trifluoroalkyl group may include linear or branched fluorinated alkyl groups having 2-12 carbon atoms, or fluorinated cycloalkyl groups having 3-17 carbon atoms.

The alkynl substituents in the tris-trialkynylsilyl group may include ethynyl groups. Any two $R^1$-$R^{87}$ in the same molecule may be linked to form a three- to eight-membered cyclic group.

The stable viscosity coating composition may further comprise a radiation sensitive photoacid generator (PAG), wherein said PAG comprises from about 0.2 to about 10.0 parts by weight per 100 parts by weight of the stable viscosity coating composition.

In the step 80 of the method 10, the coating 20, for example, the stable viscosity coating composition as described in step 115 of the method 20, depicted in FIG. 9, infra, may essentially completely fill the recesses 30 of the relief pattern 33 in the template 25 to transfer the relief pattern 33 to the coating 20.

In the step 85 of the method 10, a polymerized or cured solidified coating 20 may be formed by exposing the coating 20 to radiation 35 through the template 25. (See FIG. 6) In the step 90 of the method 10, the template 25 may be released from the coating 20 to form the relief image 40, said releasing resulting in voids 45 in the coating 20, wherein the relief image 40 may be a solidified reverse image replica of the relief pattern 33 in the template 25. (See FIGS. 6-7).

FIG. 9 is a flowsheet of a method 120 for forming a stable viscosity coating composition, comprising: a step 115, combining a vinyl ether with a stabilizer to form the stable viscosity coating composition, wherein the stable viscosity coating composition may be the same stable viscosity coating composition as described in the step 75 of the method 10.

The stable viscosity coating composition may further advantageously comprise a PAG.

Referring to FIG. 2, the method 120 may include a step 125, combining the PAG with said vinyl ether and said stabilizer, wherein said PAG comprises from about 0.2 to about 10.0 parts by weight per 100 parts by weight of the stable viscosity coating composition. The PAG may be a sulfonium salt.

Non-limiting examples of the PAG combined with the stable viscosity coating composition in step 125 of the method 120 are represented by at least one of the following structures (X-XII):

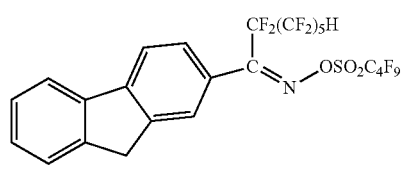

(X)

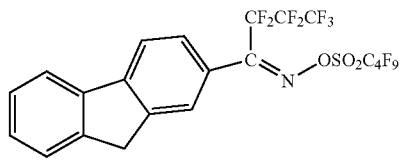

(XI)

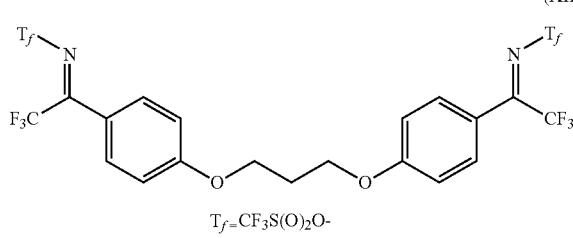

(XII)

$T_f$=CF$_3$S(O)$_2$O-

In the step 125 of the method 120, the molar ratio of the stabilizer to the PAG in the stable viscosity coating composition may be from about 0.01 to about 0.2.

In the step 130 of the method 120, the stable viscosity coating composition may be polymerized and form a higher viscosity coating such as solid coating by exposing the stable viscosity coating composition to radiation, such as UV light.

While almost all the PAGs generate acid upon exposure to short wavelength UV<300 nm, addition of the substituted 9-anthracenemethanol (VII) or the substituted phenothiazine (VIII) sensitizes sulfonium PAGs and nonionic (X-XII) PAGs to near UV (365 nm) radiation, which is an added advantage of the use of the substituted 9-anthracenemethanol (VII) or the substituted phenothiazine (VIII) in the stable viscosity coating composition. Hg discharge lamps have a low output in the deep UV region (<300 nm) and the vinyl ethers strongly absorb in the region, lowering acid generation efficiency. Utilization of the strong near UV radiation without interference by the vinyl ether component is desirable in terms of photospeed and throughput.

The stabilizer may sensitize the sulfonium salts so that the sulfonium salts generate acid upon exposure to UV radiation having a wavelength not exceeding 365 nm.

The inventors have found from measurement of the shelf life of the stable viscosity coating composition that it has an increased shelf life, as compared to a shelf life of a corresponding stable viscosity coating composition that does not include the stabilizer by a factor of greater than 2, wherein shelf life is defined as ($T_f$-$T_i$), wherein $T_i$ is an initial time when the vinyl ether is combined with the PAG, and $T_f$ is a final time when a viscosity of the stabilized stable viscosity coating composition has increased to a viscosity greater than or equal to 10 cps, at 20° C.

PAGs, also known as photoacid generators, may be advantageously used in the stable viscosity coating composition of the invention. These photoacid generators are compounds that generate an acid upon exposure to radiation. Any suitable photoacid generating agent may be used, so long as a mixture of the aforementioned stable viscosity coating composition of the present invention and the selected photoacid generator dissolve sufficiently in the coating, or in the coating and an organic solvent, and the resulting solution thereof may form a coating on a substrate by a dispensing process, or spin coating, or the like. As is well known to those skilled in the art after reading the present application, the following illustrative classes of photoacid generators may be employed in various embodiments of the present invention.

Any suitable photoacid generator can be used in the stable viscosity coating compositions of the invention. Typical photoacid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, diphenyliodonium bis-(t-butylphenyl)iodonium triflate, and bis-(di-t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl) diazomethane, and bis(cyclohexylsulfonyl) diazomethane;

(4) trifluoromethanesulfonate esters of imides and hydroxyimides, e.g., α-(trifluoromethylsulfonyloxy)-bicyclo [2.2.1] hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones; and

(10) s-triazine derivatives; and

(10) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate. Such bulky acids may include at least 4 carbon atoms.

A photoacid generator that may be employed in the present invention is an onium salt, such as an iodonium salt or a sulfonium salt, and/or a succinimide derivative. In certain embodiments of the present invention, examples of the photoacid generator structures for the present invention may include, inter alia, at least one of: 4-(1-butoxynaphthyl) tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluoro ctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-buylphenyl)iodonium camphoresulfonate, and perfluorobutylsulfonyloxybicylo [2.2.1]-hept-5-ene-2,3-dicarboximide. Any of the preceding photoacid generators may be used singly or in a mixture of two or more. The specific photoacid generator selected will depend on the irradiation being used for polymerizing the stable viscosity coating composition. Photoacid generators are currently available for a variety of different wavelengths of light from the visible range to the X-ray range; thus, imaging of the stable viscosity coating composition can be performed using deep-UV, extreme-UV, e-beam, laser, or any other selected irradiation source that is deemed useful.

Example 1

Tri(Ethylene Glycol) Divinyl Ether Stable Viscosity Coating Composition

Diphenyl(p-tollyl)sulfonium triflate (0.0998 g) was dissolved in 2.0103 g of tri(ethylene glycol) divinyl ether, to which was added 0.0152 g of 9-anthracenemethanol, the substituted 9-anthracenemethanol (VII), phenothiazine or the substituted phenothiazine (VIII). The formulation was a clear free-flowing low viscosity liquid even after 5 months at room temperature. The viscosity of a similar formulation consisting of 9.9949 g of di(ethylene glycol) divinyl ether, 0.5014 g of p-tollyldiphenylsulfonium triflate, and 0.0751 g of 9-anthracenemethanol, the substituted 9-anthracenemethanol (VII), phenothiazine, or the substituted phenothiazine (VIII) was found unchanged after 6 months at room temperature.

Example 2

Dimethyl-Bis(Vinyloxymethyl)Silane Stable Viscosity Coating Composition

Another formulation containing 1.0049 g of dimethyl-bis (vinyloxymethyl)silane, 0.0204 g of at least one of the PAGs (X-XII), and 0.0030 g of 9-anthracenemethanol, the substituted 9-anthracenemethanol (VII), phenothiazine or the substituted phenothiazine (VIII) survived more than 10 months of room temperature storage. In contrast, the same Si-vinyl ether (with and without trifluoroethyl vinyl ether) and tri (ethylene glycol) divinyl ether containing 0.5 wt % of at least one of the PAGs (X-XII) without the 9-anthracenemethanol, the substituted 9-anthracenemethanol (VII), phenothiazine or the substituted phenothiazine (VIII) stabilizer solidified in 2 months.

Example 3

Accelerated Aging Experiments Di(Ethylene Glycol) Divinyl Ether

Accelerated aging experiments were carried out at 60° C. While a formulation of di(ethylene glycol) divinyl ether and diphenyl(tollyl)sulfonium triflate solidified in less than 5 days at 60° C. in the absence of a stabilizer, addition of 9-anthracenemethanol, the substituted 9-anthracenemethanol VII, phenothiazine or the substituted phenothiazine (VIII) prolonged the shelf life to 10 and 12 days at 60° C.

While the invention has been particularly shown and described with reference to embodiments thereof, it will be understood by those skilled in the art that the foregoing and other changes in form and details may be made therein without departing from the spirit and scope of the invention.

We claim:

1. A method for forming a stable viscosity coating composition, comprising combining a vinyl ether with a stabilizer to form said stable viscosity coating composition, wherein said ether comprises from about 70 to about 98.8 parts by weight per 100 parts by weight of the stable viscosity coating composition, said vinyl ether comprising:
vinyl ether having the structure:

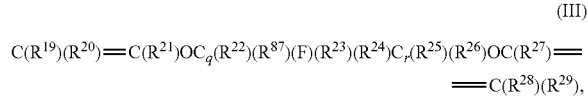

a stabilizer having the structure:

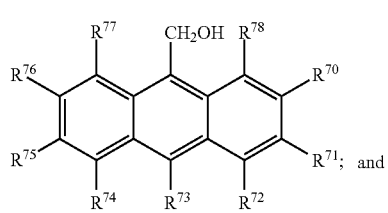

wherein selected from the group consisting of a carbon atom and a silicon atom,
wherein q and r are independently an integer from 0 to 6, wherein a sum of the integers q and r is ≤6, and
wherein each occurrence of $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{71}$, $R^{72}$, $R^{73}$, $R^{74}$, $R^{75}$, $R^{76}$, and $R^{77}$ is independently selected from the group consisting of a hydrogen atom, a fluorine atom or a hydrocarbyl substituent with a primary, a secondary or a tertiary carbon attachment point, said hydrocarbyl substituent selected from the group consisting of a linear alkyl or a linear alkoxy group having 1-6 carbon atoms, a branched alkyl or branched alkoxy group having 2-12 carbon atoms, a cycloalkyl, a bicycloalkyl, a cycloalkoxy or a bicycloalkoxy group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, an aryl group, an aralkyl group, an alkaryl group, an alkenyl group, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tris-trialkysily group, a tris-triarylsilyl group, a tris-trialkarylsilyl group, a tris-triaralkylsilyl group, a tris-trialkenylsilyl group, a tris-trifluoroalkyl group, a tris-trialkynylsilyl group, a tris-trifluoromethylsilyl group, a tris-trifluoroethylsilyl group, a tris-trifluoropropylsilyl group, a tris-cyanopropylsilyl group, and
wherein the alkyl substituents in the tris-trialkylsilyl group include linear, branched, cyclic or bicyclic alkyl substituents having 1 to 21 carbon atoms,
wherein the aryl substituents in the tris-triarylsilyl group include phenyl, naphthyl or phenanthryl,
wherein the alkaryl substituents in the tris-trialkarylsilyl group include tolyl,
wherein the aralkyl substituents in the tris-triaralkylsilyl group include benzyl,
wherein the alkenyl substituents in the tris-trialkenylsilyl group include vinyl,
wherein the fluoroalkyl substituents in the tris-trifluoroalkyl group include linear or branched fluorinated alkyl groups having 2-12 carbon atoms, or fluorinated cycloalkyl groups having 3-17 carbon atoms,
wherein the alkynyl substituents in the tris-trialkynylsilyl group include ethynyl groups, and wherein any two $R^{17}$-$R^{29}$ and $R^{71}$-$R^{78}$ in the same molecule may be linked to form a three- to eight-membered cyclic group.

2. The method of claim 1, wherein said method of forming the stable viscosity coating composition further comprises additionally combining a radiation sensitive photoacid generator (PAG) with said vinyl ether and said stabilizer, wherein said PAG comprises from about 0.2 to about 10.0 parts by weight per 100 parts by weight of the stable viscosity coating composition.

3. The method of claim 2, wherein the PAG is represented by at least one of the following structures:

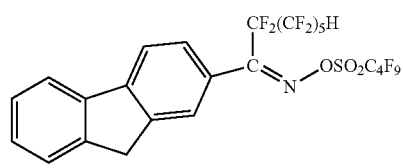

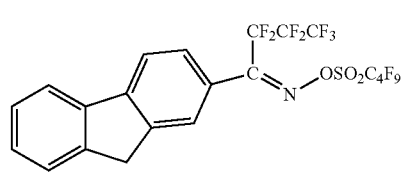

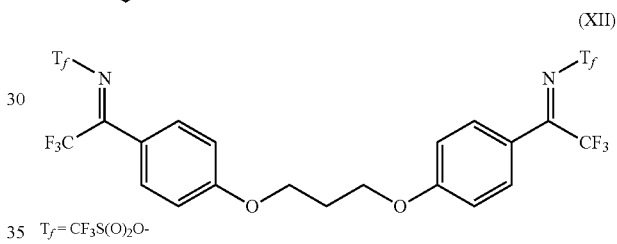

$T_f$=$CF_3S(O)_2O$-

4. The method of claim 3, wherein the molar ratio of the stabilizer to the PAG in the stable viscosity coating composition is from about 0.01 to about 0.2.

5. The method of claim 3, wherein the PAG is a sulfonium salt.

6. The method of claim 5, wherein the stabilizer sensitizes the sulfonium salts so that the sulfonium salts generate acid upon exposure to UV radiation having a wavelength not exceeding 365 nm.

7. The method of claim 3, wherein the stable viscosity coating composition has an increased shelf life, as compared to a shelf life of a corresponding stable viscosity coating composition that does not include the stabilizer by a factor of greater than 2, wherein shelf life is defined as $(T_f-T_i)$, wherein $T_i$ is an initial time when the vinyl ether is combined with the PAG, and $T_f$ is a final time when a viscosity of the stabilized stable viscosity coating composition has increased to a viscosity greater than or equal to 10 cps, at 20° C.

8. The method of claim 1, wherein the vinyl ether (III) is $CH_2$=$CHOCH_2Si(CH_3)_2CH_2OCH$=$CH_2$,
wherein F is the silicon atom,
wherein q and r are 1,
wherein $R^{19}$, $R^{20}$, $R^{21}$, $R^{22}$, $R^{25}$, $R^{26}$, $R^{27}$ $R^{28}$ and $R^{29}$ are H, and
wherein $R^{23}$ and $R^{24}$ are independently methyl groups or $CH_2$=$CHOCH_2C(CH_3)_2CH_2OCH$=$CH_2$,
wherein F is the carbon atom,
wherein q and r are 1,
wherein $R^{19}$, $R^{20}$, $R^{21}$, $R^{22}$, $R^{25}$, $R^{26}$, $R^{27}$, $R^{28}$ and $R^{29}$ are H, and
wherein $R^{23}$ and $R^{24}$ are methyl groups.

9. The method of claim 1, wherein the vinyl ether (III) is CH(CH$_3$)=CHOCH$_2$Si(CH$_3$)(CH$_2$OCH=CH(CH$_3$))CH$_2$OCH=CH(CH$_3$),
wherein F is the silicon atom, wherein q and r are 1,
wherein R$^{19}$, R$^{21}$, R$^{22}$, R$^{25}$, R$^{26}$, R$^{27}$ and R$^{28}$ are H,
wherein R$^{20}$, R$^{23}$ and R$^{29}$ are methyl, and
wherein R$^{24}$ is —CH$_2$OCH=CH(CH$_3$).

10. A method for forming a stable viscosity coating composition, comprising combining a vinyl ether with a stabilizer to form said stable viscosity coating composition, wherein said ether comprises from about 70 to about 98.8 parts by weight per 100 parts by weight of the stable viscosity coating composition, said vinyl ether comprising:

a vinyl ether having the structure:

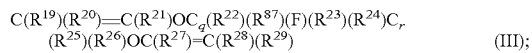

at least one stabilizer selected from the group consisting of:

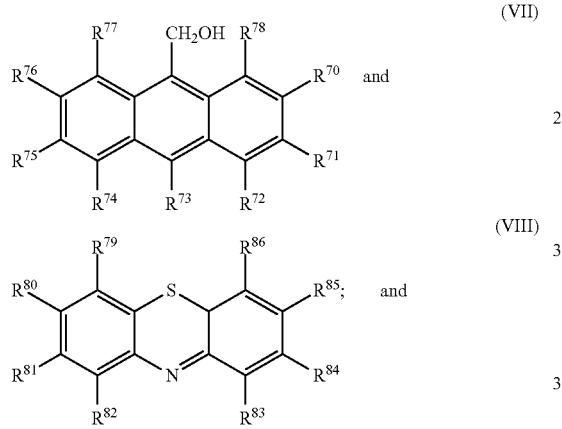

wherein F is selected from the group consisting of a carbon atom and a silicon atom,
wherein q and r are independently an integer from 0 to 6,
wherein a sum of the integers q and r is ≤6, and
wherein each occurrence of R$^{19}$, R$^{20}$, R$^{21}$, R$^{22}$, R$^{23}$, R$^{24}$, R$^{25}$, R$^{26}$, R$^{27}$, R$^{28}$, R$^{29}$, R$^{71}$, R$^{72}$, R$^{73}$, R$^{74}$, R$^{75}$, R$^{76}$, R$^{77}$, R$^{78}$, R$^{79}$, R$^{80}$, R$^{81}$, R$^{82}$, R$^{83}$, R$^{84}$, R$^{85}$, R$^{86}$ and R$^{87}$ is independently selected from the group consisting of a hydrogen atom, a fluorine atom or a hydrocarbyl substituent with a primary, a secondary or a tertiary carbon attachment point, said hydrocarbyl substituent selected from the group consisting of a linear alkyl or a linear alkoxy group having 1-6 carbon atoms, a branched alkyl or branched alkoxy group having 2-12 carbon atoms, a cycloalkyl, a bicycloalkyl, a cycloalkoxy or a bicycloalkoxy group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, an aryl group, an aralkyl group, an alkaryl group, an alkenyl group, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tris-trialkysily group, a tris-triarylsilyl group, a tris-trialkarylsilyl group, a tris-triaralkylsilyl group, a tris-trialkenylsilyl group, a tris-trifluoroalkyl group, a tris-trialkynylsilyl group, a tris-trifluoromethylsilyl group, a tris-trifluoroethylsilyl group, a tris-trifluoropropylsilyl group, a tris-cyanopropylsilyl group, and wherein the alkyl substituents in the tris-trialkylsilyl group include linear, branched, cyclic or bicyclic alkyl substituents having 1 to 21 carbon atoms, wherein the aryl substituents in the tris-triarylsilyl group include phenyl, naphthyl or phenanthryl, wherein the alkaryl substituents in the tris-trialkarylsilyl group include tolyl, wherein the aralkyl substituents in the tris-triaralkylsilyl group include benzyl, wherein the alkenyl substituents in the tris-trialkenylsilyl group include vinyl, wherein the fluoroalkyl substituents in the tris-trifluoroalkyl group include linear or branched fluorinated alkyl groups having 2-12 carbon atoms, or fluorinated cycloalkyl groups having 3-17 carbon atoms, wherein the alkynl substituents in the tris-trialkynylsilyl group include ethynyl groups, and wherein any two R$^{19}$-R$^{29}$ and R$^{71}$-R$^{87}$ in the same molecule may be linked to form a three- to eight-membered cyclic group.

11. The method of claim 10, wherein the vinyl ether (III) is CH$_2$=CHOCH$_2$Si(CH$_3$)$_2$CH$_2$OCH=CH$_2$,
wherein F is the silicon atom,
wherein q and r are 1,
wherein R$^{19}$, R$^{20}$, R$^{21}$, R$^{22}$, R$^{25}$, R$^{26}$, R$^{27}$R$^{28}$ and R$^{29}$ are H, and
wherein R$^{23}$ and R$^{24}$ are independently methyl groups or CH$_2$=CHOCH$_2$C(CH$_3$)$_2$CH$_2$OCH=CH$_2$,
wherein F is the carbon atom,
wherein q and r are 1,
wherein R$^{19}$, R$^{20}$, R$^{21}$, R$^{22}$, R$^{25}$, R$^{26}$, R$^{27}$R$^{28}$ and R$^{29}$ are H, and
wherein R$^{23}$ and R$^{24}$ are methyl groups.

12. The method of claim 10, wherein the vinyl ether (III) is CH(CH$_3$)=CHOCH$_2$Si(CH$_3$)(CH$_2$OCH=CH(CH$_3$))CH$_2$OCH=CH(CH$_3$),
wherein F is the silicon atom, wherein q and r are 1,
wherein R$^{19}$, R$^{21}$, R$^{22}$, R$^{25}$, R$^{26}$, R$^{27}$ and R$^{28}$ are H,
wherein R$^{20}$, R$^{23}$ and R$^{29}$ are methyl, and
wherein R$^{24}$ is —CH$_2$OCH=CH(CH$_3$).

* * * * *